(12) United States Patent
Jung

(10) Patent No.: US 7,135,737 B2
(45) Date of Patent: Nov. 14, 2006

(54) NON-VOLATILE FLASH MEMORY DEVICE

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/023,426

(22) Filed: Dec. 29, 2004

(65) Prior Publication Data

US 2005/0139897 A1 Jun. 30, 2005

(30) Foreign Application Priority Data

Dec. 31, 2003 (KR) .................... 10-2003-0101072

(51) Int. Cl.
*H01L 29/788* (2006.01)
(52) U.S. Cl. .................. 257/320; 257/316; 257/320; 257/326
(58) Field of Classification Search .............. 257/320
See application file for complete search history.

(56) References Cited

U.S. PATENT DOCUMENTS

| 5,284,784 | A | * | 2/1994 | Manley | ............... 438/263 |
|---|---|---|---|---|---|
| 5,567,300 | A | | 10/1996 | Datta et al. | |
| 6,093,945 | A | * | 7/2000 | Yang | ............... 257/317 |
| 6,143,155 | A | | 11/2000 | Adams et al. | |
| 6,462,375 | B1 | * | 10/2002 | Wu | ............... 257/316 |
| 6,638,409 | B1 | | 10/2003 | Huang et al. | |
| 2002/0086556 | A1 | * | 7/2002 | Ahn et al. | ............... 438/785 |
| 2003/0080372 | A1 | * | 5/2003 | Mikolajick | ............... 257/315 |
| 2005/0035393 | A1 | * | 2/2005 | Lung et al. | ............... 257/314 |

\* cited by examiner

*Primary Examiner*—Andy Huynh
*Assistant Examiner*—Earl Taylor
(74) *Attorney, Agent, or Firm*—Finnegan, Henderson, Farabow, Garrett, & Dunner, L.L.P.

(57) ABSTRACT

A non-volatile memory device having sidewall floating gates implementing two bits with just one transistor is disclosed. A disclosed method comprises a non-volatile memory device having a unit cell comprising: a transistor including a polysilicon gate, sidewall floating gates, block oxide layers and source and drain regions; a word line vertically placed on a substrate and connected to the polysilicon gate; and a pair of bit lines orthogonally placed to the word line and connected to the source and drain regions.

7 Claims, 7 Drawing Sheets

NON-VOLATILE FLASH MEMORY DEVICE

BACKGROUND OF THE INVENTION

1. Field of the Invention

The present disclosure relates generally to a semiconductor fabrication and, more particularly, to a non-volatile memory device having sidewall floating gates which can control two bits with just one transistor.

2. Background of the Related Art

In general, there are two categories in semiconductor devices, namely, a volatile memory and a non-volatile memory. The volatile memory again includes a dynamic random access memory (hereinafter referred to as "DRAM") and a static DRAM (hereinafter referred to as "SDRAM"). One characteristic of the volatile memory is that data are maintained just while electric power is being applied. In other words, when power is turned off, the data in the volatile memory disappear. On the other hands, the non-volatile memory, mainly a ROM (Read Only Memory), can keep the data regardless of the application of electric power.

From the point of a view of the fabrication process, the non-volatile memory is divided into a floating gate type and a metal insulator semiconductor (hereinafter referred to as "MIS") type. The MIS type has doubly or triply deposited dielectric layers which comprise at least two kinds of dielectric materials.

The floating gate type stores data using potential wells, and is represented by an ETOX (Electrically erasable programmable read only memory Tunnel OXide) used in a flash EEPROM (Electrically Erasable Programmable Read Only Memory).

The MIS type performs the program operation using traps at a bulk dielectric layer, an interface between dielectric layers, and an interface between a dielectric layer and a semiconductor. A Metal/Silicon ONO Semiconductor (hereinafter referred to as "MONOS/SONOS") structure mainly used for the flash EEPROM is a representative MIS structure.

A conventional SONOS memory device comprises a tunnel oxide layer, a trap nitride layer and a block oxide layer on a P-type silicon substrate, and a gate deposited thereon.

In the SONOS memory device, a program operation is performed by FN (Fowler-Nordheim)-tunneling or directly tunneling electrons so that the electrons are trapped at a predetermined site in the trap nitride layer, thereby increasing a threshold voltage. An erase operation also moves the electrons by various tunneling ways such as the FN-tunneling, the direct tunneling, and trap assisted tunneling so that the electrons are withdrawn from the P-type silicon substrate, thereby decreasing the threshold voltage.

Because the conventional SONOS device has employed the tunneling method for both the program and erase operations as described above, the thickness of the tunnel oxide has to be at most about 20 Å to achieve an adequate program/erase operating speed. However, the thin thickness of the tunnel oxide may detrimentally affect the retention characteristic of the memory device. Thus, various methods have been provided to solve such a problem in the SONOS device. One known method is to thicken the tunnel oxide layer, employ a thermal electron injection to perform the program operation, and a hot hole injection to perform the erase operation, thereby improving the retention characteristic. However, the above-described method radically deteriorates the endurance characteristic of the SONOS device.

FIG. 1 is a cross-sectional view illustrating a conventional floating gate of a single bit stack gate type.

Referring to FIG. 1, a tunneling oxide layer comprising an $SiO_2$ layer 14 is formed on a P-type silicon substrate 11. A polysilicon floating gate 15 is formed on the tunneling oxide layer of the resulting structure. An oxide-nitride-oxide (hereinafter referred to as "ONO") layer 16 is formed to increase the coupling ratio. A control gate 17 is formed on the ONO layer 16. A source 13 and drain 12 are then made adjacent to the both sides of bottom of the $SiO_2$ layer 14.

FIG. 2 represents a graph illustrating the distribution of the threshold voltage of the program/erase operations of the conventional floating gate of a single bit stack gate type.

Referring to FIG. 2, the threshold voltage of a cell 18 can become under 0[V] by an over-erase during the erase operation. In that case, the threshold distribution of the erase operation is wider than that of the program operation, thereby decreasing a threshold voltage window. In other words, just one over-erased cell in the bit line may induct excessive current into the bit line and, therefore, interrupt reading data of other cells along the bit line. Such over-erase may be caused by various structural problems such as a critical dimension in the cell of the flash memory, the thickness of the tunneling oxide layer, a junction overlap, the critical dimension of the floating gate, unevenness of the surface of the floating gate, the thickness of the ONO layer, the damage of the tunneling oxide layer, and pin holes. A well-known conventional method for solving the over-erase problem comprises the steps of detecting an over-erased cell, and reprogramming the detected over-erased cell in order to increase the threshold voltage thereof.

However, detecting the over-erased cell is a time-consuming job and, additionally, complicated circuits are required to recover the detected over-erased cell. Moreover, the threshold voltage distribution during the erase operation is wide and affects the threshold voltage distribution of a later program operation. Consequently, the threshold window voltage decreases and a multi-level bit is difficult to achieve in accordance with the conventional art methods.

SUMMARY OF INVENTION

A primary object of the present invention is to efficiently and effectively perform program/erase operations with a device having a sidewall floating gate which can control two bits with only one transistor.

To achieve these objects and other advantages and in accordance with the purpose of the invention, as embodied and broadly described herein, the present invention provides a non-volatile memory device having a unit cell comprising: a transistor including a polysilicon gate, sidewall floating gates, block oxide layers and source and drain regions; a word line vertically placed on a substrate and connected to the polysilicon gate; and a pair of bit lines orthogonally placed to the word line and connected to the source and drain regions.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Figure 1:
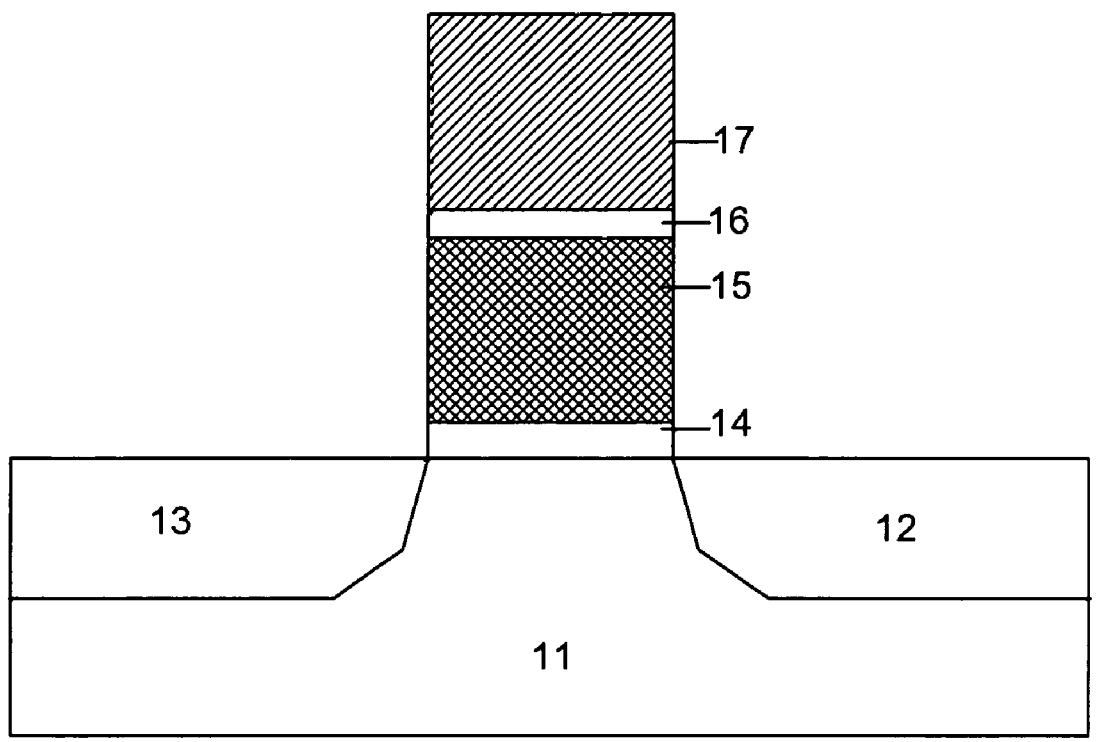
FIG. 1 is a cross-sectional view illustrating a conventional floating gate of a single bit stack gate type.
Figure 2:
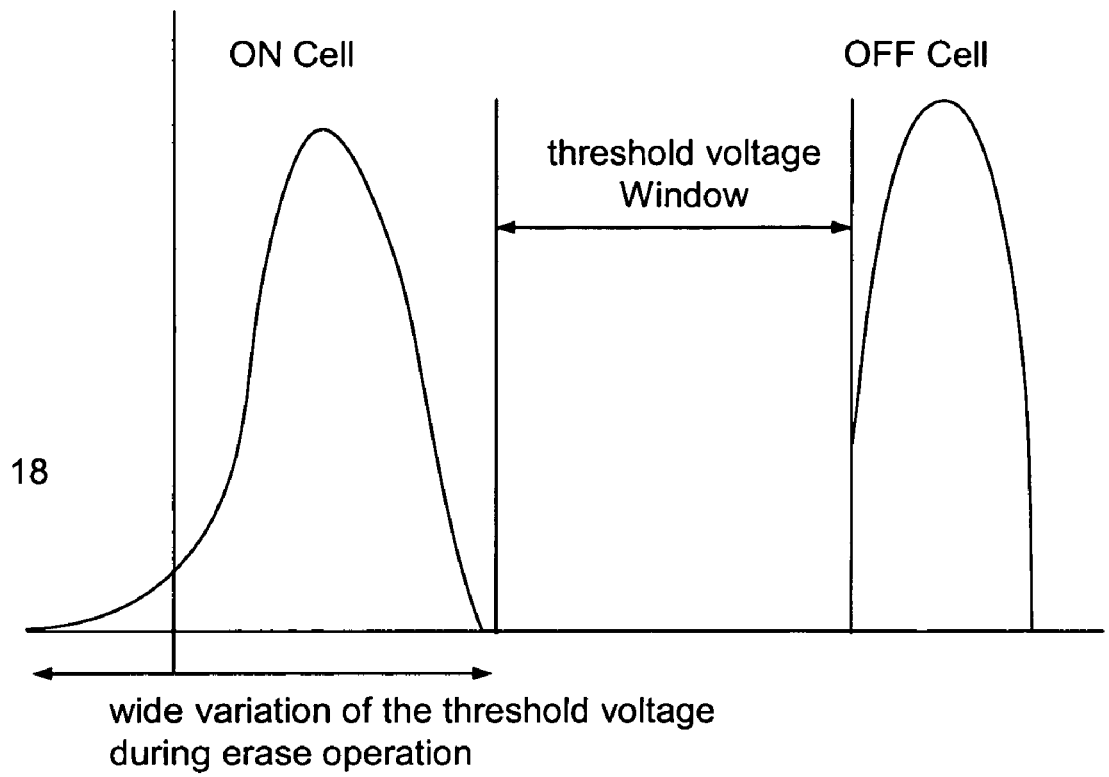
FIG. 2 represents a graph illustrating the distribution of the threshold voltage of the program/erase operations of the conventional floating gate of a single bit stack gate type.
Figure 3:
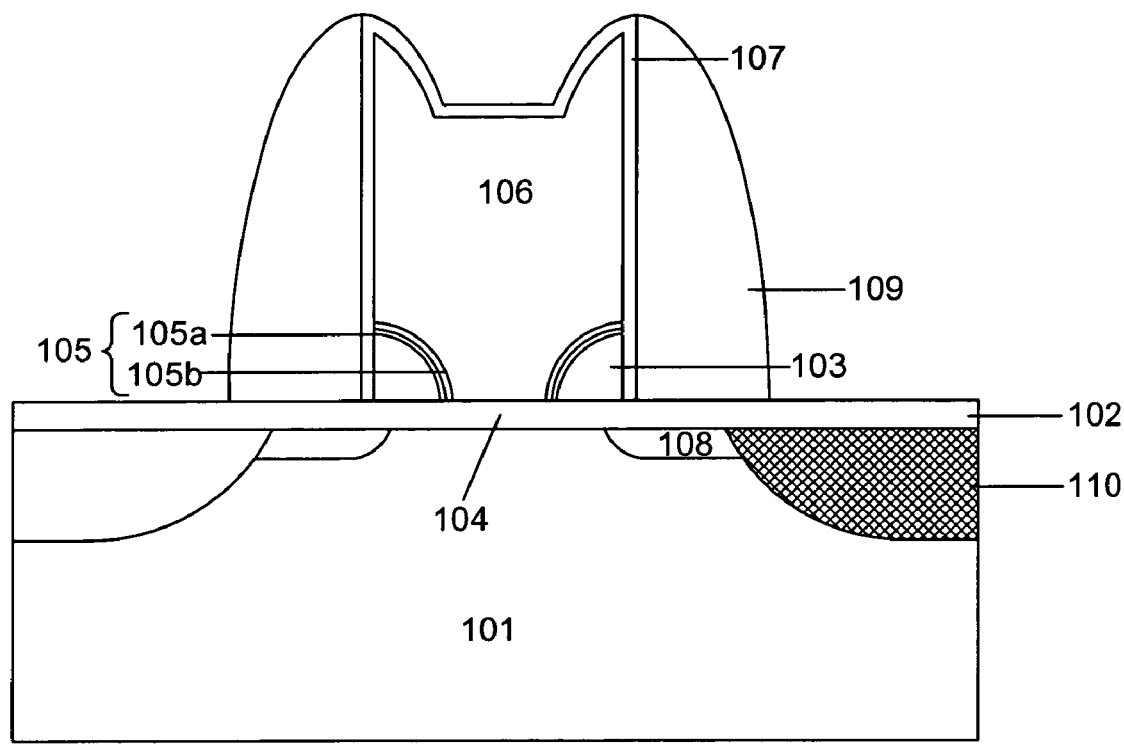
FIG. 3 is a cross-sectional view illustrating a non-volatile memory device having a sidewall floating gate which can control two bits with one transistor in accordance with the present invention.

FIG. 3 is a cross-sectional view illustrating a non-volatile memory device having a sidewall floating gate which can control two bits with one transistor in accordance with the present invention.

Referring to FIG. 3, a gate oxide layer 104 is grown on a semiconductor substrate 101. A polysilicon gate 106 is positioned on the gate oxide layer 104. Sidewall floating gates 103 are placed on the bottom of the lateral faces of the polysilicon gate 106. Block oxide layers 105 is placed between the polysilicon gate 106 and the sidewall floating gates 103. The block oxide layers 105 comprise first block oxide layers 105a and second block oxide layers 105b. The first block oxide layers 105a have a thickness ranging between 50 Å and 250 Å and are made of a material selected from the group consisting of $Al_2O_3$ and $Y_2O_3$. The second block oxide layers 105b preferably have a thickness ranging between 20 Å and 150 Å and are made of $SiO_2$. A tunnel oxide layer 102 is positioned between the sidewall floating gates 103 and the semiconductor substrate 101. Sidewall spacers 109 are placed on a sidewall of the polysilicon gate 106 and the lateral faces of the sidewall floating gates 103. Source and drain regions 110 are placed adjacent to source/drain extension areas 108. The polysilicon gate 106 may be a 'T' shaped gate electrode, which means that the upper part of the polysilicon gate 106 is wider than the lower part of the polysilicon gate 106. In addition, polysilicon oxide layer 107 is placed between the sidewall spacers 109 and the polysilicon gate 106, between the sidewall spacers 109 and the sidewall floating gates 103, and directly on top of the polysilicon gate 106.

According to FIG. 3, one transistor is capable of controlling two bits by changing potential walls of the surface of the semiconductor substrate 101 under the sidewall floating gates 103 by means of injecting electrons into or withdrawing electrons from the sidewall floating gates 103.

Figure 4:
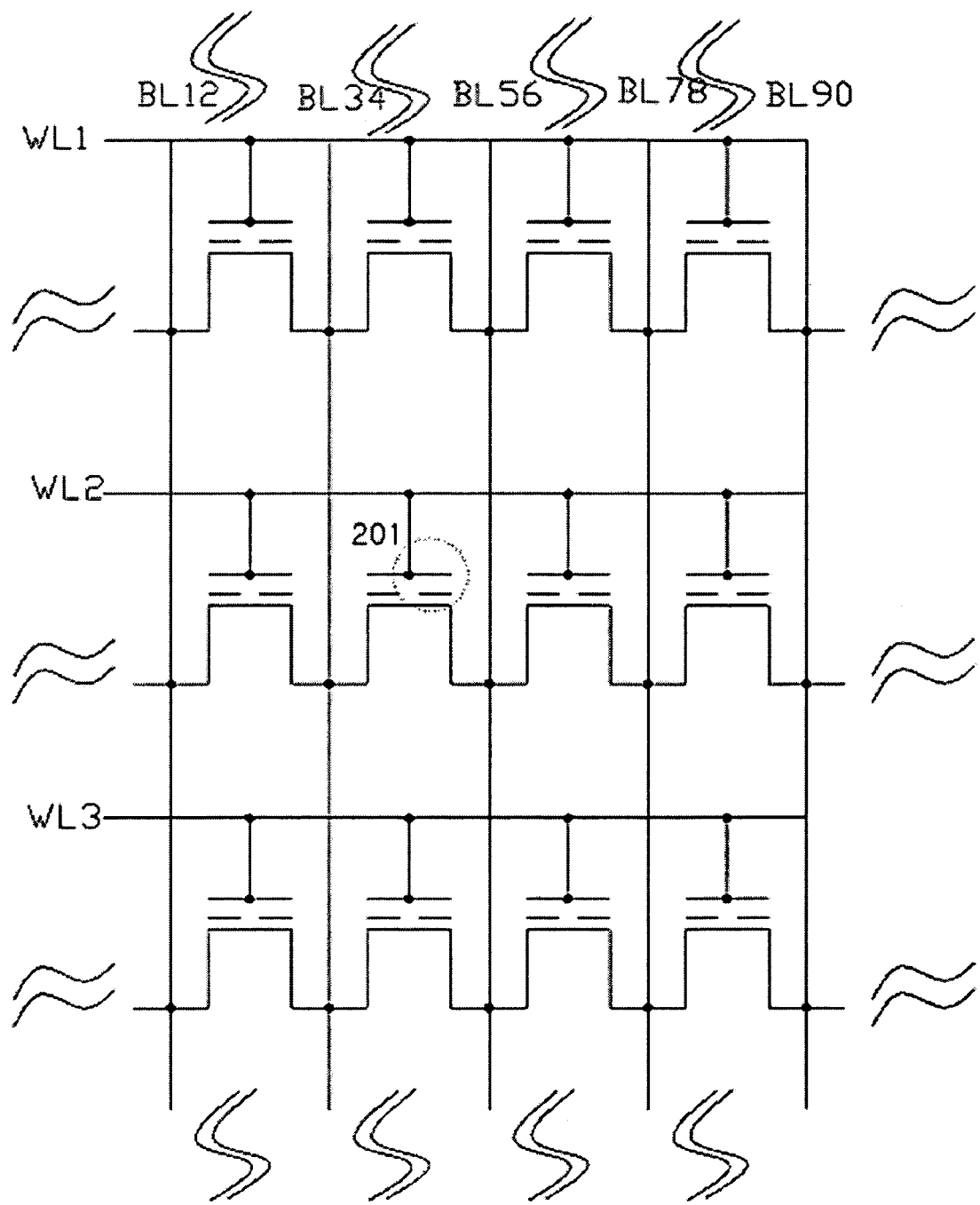
FIG. 4 is a NOR flash array of the non-volatile memory device in accordance with the present invention.

FIG. 4 is a NOR flash array of the non-volatile memory device in accordance with the present invention.

Referring to FIG. 4, a unit cell of the NOR flash array comprises a transistor, a word line and a bit line. The transistor includes a polysilicon gate, sidewall floating gates, block oxide layers and source and drain regions. The word line is connected to the polysilicon gate and horizontally placed on a substrate. The bit line is placed orthogonally to the word line and connected to the source and drain regions.

Table 1 illustrates the voltage applied to the word line, the bit line and a body of the two bit sidewall floating gate 201 selectively performing program, read, and erase operations in a block level.

TABLE 1

|  | WL1 | WL2 | WL3 | BL12 | BL34 | BL56 | BL78 | BL90 | Body |
|---|---|---|---|---|---|---|---|---|---|
| Erase1 | −Vwle | −Vwle | −Vwle | F | F | F | F | F | 0/Vb |
| Erase2 | −Vwle | −Vwle | −Vwle | 0/Ve | 0/Ve | 0/Ve | 0/Ve | 0/Ve | F |
| Program | 0 | −Vwlp | 0 | 0 | 0 | Vblp | Vblp | Vblp | 0 |
| Read | 0 | Vref | 0 | Vblp | Vblp | 0 | 0 | 0 | 0 |

The erase operation in the block level can be performed by two ways. One is to move electrons from the sidewall floating gate toward the channel by F/N-tunneling the electrons. The other is to carry electrons from the sidewall floating gate toward the source and drain regions by the F/N-tunneling.

In Table 1, Erase1 is performed under a bias condition where electrons are moved from the sidewall floating gates toward the channel by the F/N-tunneling. In detail, −Vwle [V] is applied to the word lines (WL1, WL2, WL3), and 0[V] and Vb[V] are applied to the body and the bit lines (BL12, BL34, BL56, BL78, BL90) are floated to perform the Erase1. Therefore, a strong field is applied from the channel toward the sidewall floating gate, leading to moving the electrons contained in the potential well toward the substrate by the F/N-tunneling, thereby decreasing the threshold voltage. In this case, because another strong field can be applied from the channel toward the word line (polysilicon gate), an adequate bias condition for performing Erase1 should be defined to prevent the occurrence of breakdowns from the channel to the word line during the F/N-tunneling.

Erase2 is conducted under a bias condition where electrons are moved from the sidewall floating gate toward the source/drain region by the F/N-tunneling. In detail, −Vwle [V] is applied to the word lines (WL1, WL2 and WL3), and 0[V] or Ve[V] is applied to the bit lines (BL12, BL34, BL56, BL78 and BL90) and the body is floated to perform the Erase2. Therefore, a strong field is applied from the source/drain region toward the sidewall floating gate, leading to move electrons contained in the potential well toward the source by the F/N tunneling, thereby decreasing the threshold voltage. In this case, the breakdown is not a serious consideration because a strong field from the channel toward the polysicilon gate does not appear during the erase operation.

The selective program operation is performed under a bias condition where Vwlp[V] is applied to just WL2 in the word lines, 0[V] is applied to the rest of the word lines (WL1, WL3), 0[V] is applied to the BL12 and BL34 in the bit lines and Vblp[V] is applied to the BL56, BL78 and BL90, and 0[V] is applied to the body. Under the condition described above, the voltage difference between the source and the drain arises for the two bit sidewall floating gate devices connected to the BL34 and BL56. In addition, voltage to the polysilicon gate arises for the two bit sidewall floating gate devices along the WL2. Thus, only for two bit sidewall floating gate device of the cell 201, current flows from the source to the drain. When the current flows from the source to the drain, an electric field is strongest in the area including the cell 201 and the electrons in the channel are then readily converted into hot electrons. The hot electrons are then injected into the potential wells formed on the sidewall floating gate of the cell 201 by a vertical field, thereby achieving the program operation which increases the threshold voltage. Here, optimum conditions for the Vblp and the Vwlp which are respectively applied to the bit line and the word line are determined in consideration of several factors such as hot electron injection efficiency, drain junction breakdowns, gate disturb, program current, and drain disturb. Here, the appropriate bias conditions for the Vwlp applied to the word line should be defined so as to efficiently lower the potential wall in the source, moving the electrons from the source toward the channel, regardless of the existence of the potential wall in the source due to the program operation.

The read operation is performed under a bias condition where Vref[V] is applied to the WL2, 0[V] is applied to the WL1 and WL3, Vblr is applied to the BL12 and BL34, and 0[V] is applied to the BL56, BL78, BL90 and the body. Under the condition described above, if the cell 201 is in erased state, current flows from the BL34 to the BL56. If the cell is in programmed state, current does not flow from the BL34 to the BL56. So, the program/erase state can be detected by the current flow. Here, the Vref applied to the word line during the read operation is determined as a middle voltage between the highest threshold voltage during the erase operation and the lowest threshold voltage during the program operation. In addition, a high voltage applied to the bit line during the read operation may induce an unintentional program operation for the BL34 (i.e., left side of the cell 201). Thus, a sufficiently low voltage has to be applied to prevent the unintentional program operation.

Figure 5:
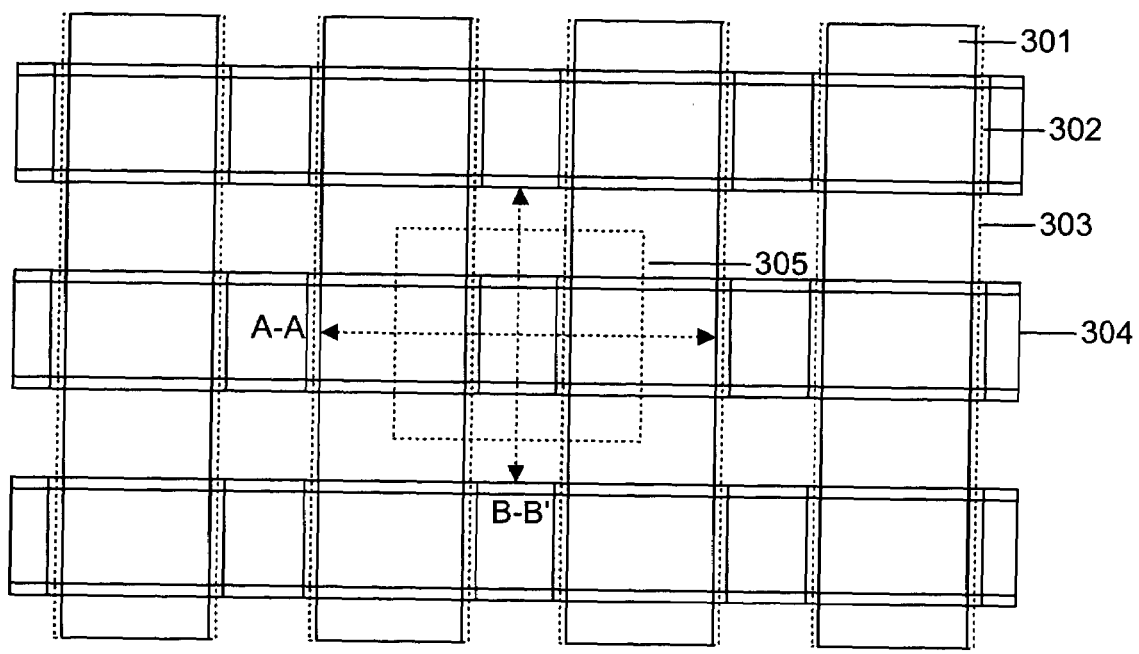
FIG. 5 is a cell layout of the NOR flash array in the non-volatile memory device.

FIG. 5 is a cell layout of the NOR flash array in the non-volatile memory device.

A pair of active regions 301, at least, are vertically and horizontally placed on a semiconductor substrate. Several word lines 304 are horizontally positioned across the top of the vertically placed active regions. Source and drain regions 303 are orthogonally positioned to the word lines and placed across the top of the horizontally placed active regions. Sidewall floating gates 303 are positioned overlapping the predetermined portion of the source and drain regions on the word lines.

Figure 6:
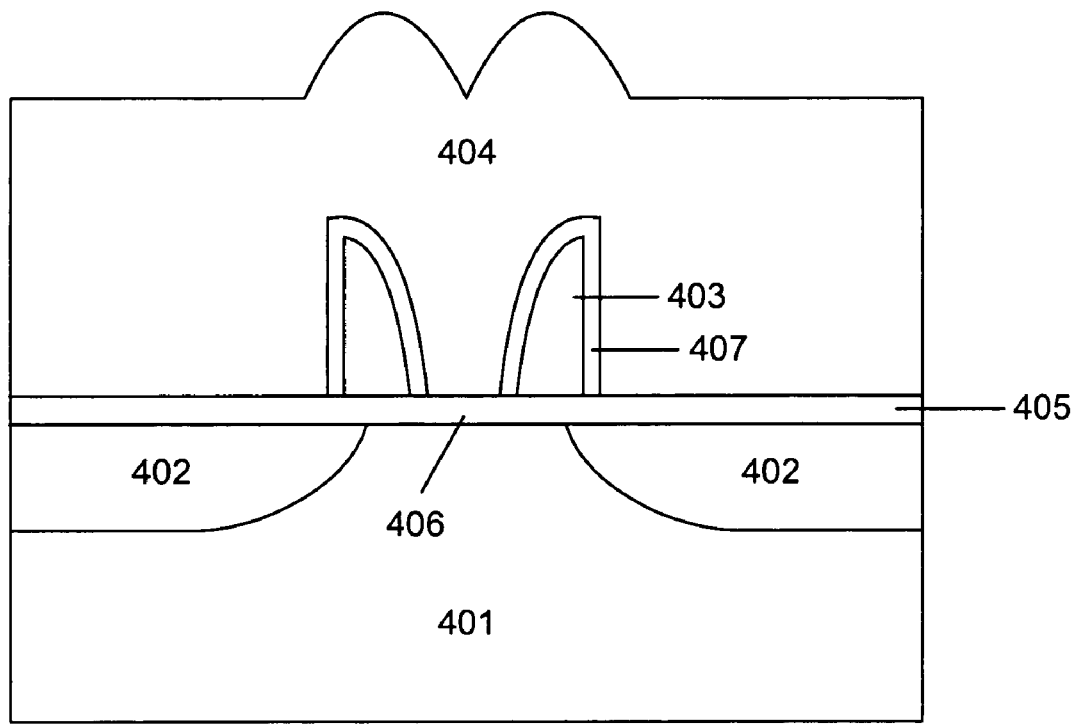
FIG. 6 is a cross-sectional view illustrating the unit cell 305 along the line A–A' in FIG. 5.

FIG. 6 is a cross-sectional view illustrating the unit cell 305 along the line A–A' in FIG. 5.

Referring to FIG. 6, a word line 404 made of polysilicon is positioned over an active region 401. Two sidewall floating gates 403 are placed facing each other on the active region. Block oxide layers 407 are placed on the sidewall floating gates 403. A gate oxide layer 406 is positioned between the word line and the active region. A tunneling oxide layer 405 is positioned between the sidewall floating gates and the active region. Source and drain regions 402 are formed adjacent to the bottom of the both sides of the sidewall floating gates.

Figure 7:
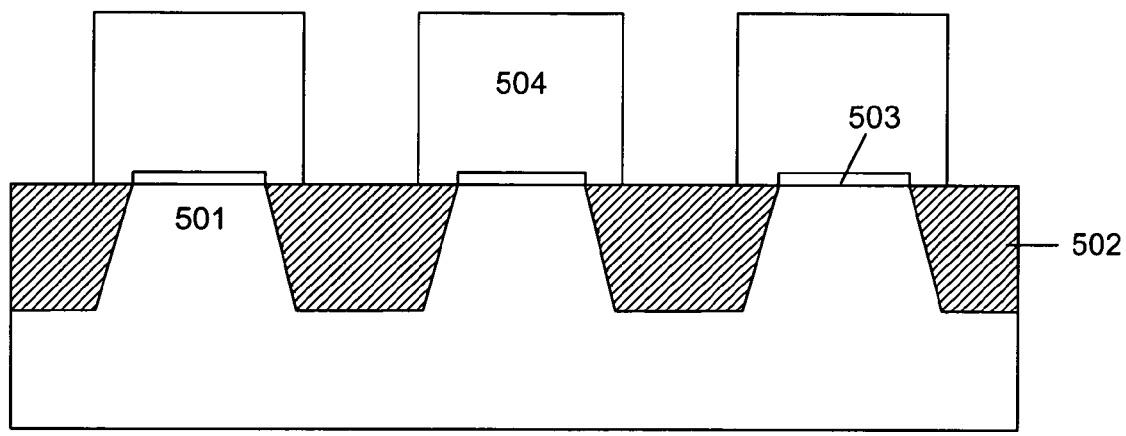
FIG. 7 is a cross-sectional view illustrating the unit cell 305 along the line B–B' in FIG. 5.

FIG. 7 is a cross-sectional view illustrating the unit cell 305 along the line B–B' in FIG. 5.

Referring to FIG. 7, active regions 501 are separated by isolation structures 502. Word lines 504 are positioned on the active regions 501. Gate oxide layers 503 are positioned between the active regions 501 and the word lines 504.

According to the two bit sidewall floating gate device described above, the present invention provides a NOR flash cell array having one transistor which can control two bits without a bit contact and effectively performs program/erase/read operations. In addition, the area of the NOR flash cell area according to the present invention may be decreased by ½ compared to the area of the conventional NOR flash cell array. Even if the sidewall floating gate is over-erased, the channel may keep "OFF" state by applying 0[V] to the word line and, therefore, read errors due to the over-erase can be prevented. Thus, no additional circuits for re-programming the erased cells are required, leading to simplify the circuit structure. Moreover, several steps, which are essential during the erase operation in the methods of prior arts, such as detecting over-erased cell, re-programming and recovering the over-erased cell, can be skipped in the present method and, thereby, the erase operation can be dramatically simplified. Furthermore, read errors caused when unselected cells are in "ON" state by the voltage of the bit line drain can be prevented by applying 0[V] to the unselected cells to make the channel "OFF" state.

Accordingly, using a two bit sidewall floating gate device, the present invention provides a NOR flash cell array comprising one transistor which can control two bits without a bit contact, effectively performing program/erase/read operations, and preventing various problems such as over-erase and drain turn-on.

It is noted that this patent claims priority from Korean Patent Application Serial Number 10-2003-0101072, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A non-volatile memory device having a unit cell comprising:
    a transistor including a gate oxide layer on a substrate, a polysilicon gate contacting the gate oxide layer, sidewall floating gates, a tunnel oxide layer between the sidewall floating gates and the substrate, block oxide layers, a sidewall spacer on a side of the polysilicon gate and a side of the sidewall floating gates, a polysilicon oxide layer which covers a top and the side of the polysilicon gate and the side of the sidewall floating gates, and source and drain regions;
    a word line vertically placed on the substrate and connected to the polysilicon gate; and
    a pair of bit lines orthogonally placed to the word line and connected to the source and drain regions.

2. The device as defined by claim 1, wherein the non-volatile memory device has no bit line contact.

3. The device as defined by claim 1, wherein the polysilicon gate is a 'T' shaped gate, which means that the upper part of the polysilicon gate is wider than the lower part of the polysilicon gate.

4. The device as defined by claim 1, wherein the block oxide layers comprise first block oxide layers and second block oxide layers.

5. The device as defined by claim 4, wherein the first block oxide layers have a thickness ranging between 50 Å and 250 Å and are made of a material selected from a group consisting of $Al_2O_3$ and $Y_2O_3$.

6. The device as defined by claim 4, wherein the second block oxide layers have a thickness ranging between 20 Å and 150 Å and are made of $SiO_2$.

7. The device as defined by claim 1, wherein a threshold voltage of the sidewall floating gates decreases as an erase operation time increases and converges to a predetermined threshold voltage at the end of the erase operation.

* * * * *